United States Patent [19]

Kerfeld

[11] 4,374,077
[45] Feb. 15, 1983

[54] PROCESS FOR MAKING INFORMATION CARRYING DISCS

[75] Inventor: Donald J. Kerfeld, St. Paul, Minn.

[73] Assignee: Minnesota Mining and Manufacturing Company, St. Paul, Minn.

[21] Appl. No.: 117,467

[22] Filed: Feb. 1, 1980

[51] Int. Cl.³ .............................................. B29D 11/00
[52] U.S. Cl. ..................................... 264/22; 264/106; 264/175
[58] Field of Search .................... 264/1.4, 219, 22, 1.6, 264/236, 175, 106, 107, 219, 220, 225; 428/64, 65, 163, 220; 204/6; 427/164

[56] References Cited

U.S. PATENT DOCUMENTS

| | | | |
|---|---|---|---|
| 3,658,954 | 4/1972 | Broadbent | 264/1.3 |
| 3,795,534 | 3/1974 | Mehalso et al. | 427/39 |
| 3,798,134 | 3/1974 | Hynes | 204/6 |
| 3,855,426 | 12/1974 | Bouwhuis | 179/100.3 V |
| 3,901,994 | 8/1975 | Mehalso et al. | 428/163 |
| 3,945,788 | 3/1976 | Inoue et al. | 264/220 |
| 4,006,271 | 2/1977 | French et al. | 427/164 |
| 4,017,581 | 4/1977 | Amidon | 264/220 |
| 4,049,861 | 9/1977 | Nozari | 428/220 |
| 4,054,635 | 10/1977 | Schlesinger et al. | 264/219 |
| 4,101,513 | 7/1978 | Fox et al. | 526/193 |
| 4,124,672 | 11/1978 | Jarsen | 264/311 |
| 4,126,726 | 11/1978 | Soeding | 428/163 |
| 4,130,620 | 12/1978 | Jarsen | 264/225 |
| 4,175,177 | 11/1979 | Potts | 264/22 |
| 4,199,421 | 4/1980 | Kamada et al. | 264/1.4 |
| 4,225,379 | 9/1980 | Ishii et al. | 428/64 |
| 4,272,574 | 6/1981 | Lippitis et al. | 428/64 |
| 4,294,782 | 10/1981 | Froehlig | 264/106 |
| 4,296,158 | 10/1981 | Lewis | 428/65 |
| 4,304,806 | 12/1981 | Anderson et al. | 428/64 |

FOREIGN PATENT DOCUMENTS

| | | | |
|---|---|---|---|
| 859711 | 4/1978 | Belgium . | |
| 15834 | 9/1980 | European Pat. Off. | 264/106 |
| 1107958 | 5/1961 | Fed. Rep. of Germany | 428/64 |
| 2519476 | 5/1977 | Fed. Rep. of Germany . | |

*Primary Examiner*—Jay H. Woo
*Attorney, Agent, or Firm*—Cruzan Alexander; Donald M. Sell; Mark A. Litman

[57] ABSTRACT

Imperfections in the surface of information carrying discs, such as video discs, are avoided by an improved process of manufacture. A bead of photopolymerizable mass is moved between two surfaces, one of which is a patterned surface and the other is a surface to which the photopolymerizable mass will bond upon polymerizing. By moving the liquid mass across the patterned surface, air within the pattern is removed by the leading edge of the bead, reducing imperfections.

14 Claims, 3 Drawing Figures

PROCESS FOR MAKING INFORMATION CARRYING DISCS

FIELD OF THE INVENTION

The present invention relates to information carrying systems and more particularly to discs which carry light readable or stylus readable information. These discs may be useful in carrying information which is convertible to electronic signals for such varied uses as sound recordings, audio/visual recordings, or even computer type information retrieval.

BACKGROUND OF THE INVENTION

Information retrieval in the form of discs having information distributed in a circular, arc-like, or spiral pattern has been available in various forms for many years. Early forms of musical reproduction equipment, for example, used discs with either holes or protuberances to pluck an array of strings or vibrating posts to produce music. Early displays of moving pictures operated by rotation of a disc bearing consecutive images on the periphery. The most common form of storing reproductions of musical performances, which has been in use for about one hundred years, is the phonograph record which uses a spiral pattern of grooves having vertical and horizontal modulations to generate signals which can be converted to sound.

With the introduction of the laser to industry, a new information storage system was developed which comprised a disc having a circular or spiral pattern of depressions or protuberances which would disturb, reflect, or refract incident light patterns. These information storing discs, often used for storage of audio/visual information and generally referred to as video discs, are well known in the art. Such U.S. Pat. Nos. as 3,658,954 (Apr. 25, 1972); 3,795,534 (Mar. 5, 1974); 3,798,134 (Mar. 19, 1974); 3,855,426 (Dec. 17, 1974); 3,901,994 (Aug. 26, 1975); 4,124,672 (Nov. 7, 1978); 4,126,716 (Nov. 21, 1978); and 4,130,620 (Dec. 19, 1978) show various constructions, compositions, and processes for forming video discs.

In addition to the laser readable video disc, another commercial construction is used which is more similar to the classic phonograph recording. This type of construction, as described in RCA Review, Vol. 39, No. 1 March, 1978, comprises a spiral array of grooves which is tracked by a stylus. The grooves are impressed with coded information in the form of vertical and/or radial modulations.

Even though these systems are read by totally different techniques, they are affected by similar, if not identical, problems. Imperfections in the depressions, protuberances, or modulations cause undesirable or spurious signals to be generated. The imperfections can be produced during manufacture of the disc or can develop from wear during use or manipulation of the disc.

The present invention relates to information storage discs for use with laser or stylus readout systems which have good fidelity and resistance to wear.

More particularly, the present invention relates to a process for forming information storage discs or disc blanks for use with laser or stylus readout systems.

SUMMARY OF THE INVENTION

It has been found according to the present invention that high density information storage discs or disc blanks comprising discs having a circular, arc-like, or spiral pattern of depressions, protuberances, and/or grooves with or without (in the case of blanks) modulations, can be made by photopolymerization of a liquid mass properly deposited between a stamper and a substrate to which the polymerized mass is to adhere. The photopolymerizable mass is deposited by moving a bead or wave of the photopolymerizable liquid between a flexible substrate or flexible stamper and the corresponding optical disc stamper or substrate so as to fill the pattern in the stamper and then irradiating the photopolymerizable mass, through either the stamper or the substrate.

The process of the present invention generally comprises the use of at least one flexible sheet, either the substrate, which would carry the information layer, or the stamper, (which may be a video disc or video disc blank stamper) to spread a bead of photopolymerizable liquid over a surface (corresponding to a video disc stamper or substrate) and the polymerization of the liquid by exposure to radiation through the substrate or disc stamper.

The use of liquid photopolymerizable materials to form replicated information carrying discs is known in the art, such as for example Belgian Pat. No. 859,711. The process of the present invention provides a number of advantages over prior art methods, including those using photopolymerizable liquids.

The prior art processes, involving the deposition of the liquid on the stamper or substrate (by knife coating or spin coating) and subsequent application of the substrate, are two step processes. The substrate is usually layed over the liquid coated master and the amounts of liquid material and its general displacement over the master is difficult to control. Excess liquid is usually applied to insure minimum thickness in the information carrying layer.

The advancement of the bead of liquid by the substrate being rolled out over the master has been found to remove substantially all of the air in the mold. The leading edge of the bead tends to pick up and carry the air without redepositing it in progressive features of the master because the air bubbles rupture, releasing the gas. This eliminates beading and wicking of the thin liquid film both of which create voids. The need for levelling agents, which can deleteriously affect the physical properties of the coating or raise the cost of materials used is avoided.

The process of the present invention also offers advantages over the thermal molding or embossing processes of the prior art. Photopolymerization can, with reasonable selection of photocatalysts or photoinitiators, be performed at faster rates and with simpler equipment with no loss of quality as compared to thermal molding and embossing processes. Little pressure is used and no heat curing is required, so little stress is applied to or built into the discs. Because little stress and softer materials are used, the life of the stamper is believed to also be extended. In fact, with the process of the present invention, a non-metallic master may be used to provide numerous replications. Such organic resin stampers (usually with a thin metal coating) are far less expensive than metal stampers used in conventional processes.

As long as the substrate or master is able to bend sufficiently to enable the formation of a bead and propagation of that bead as the bend-point is moved forward, the substrate or master is sufficiently flexible. Materials that would otherwise be considered semi-flexible are therefore useful in the practice of the present invention.

These and other features can be seen with a review of the drawings.

DETAILED DESCRIPTION OF THE INVENTION

Figure 1:
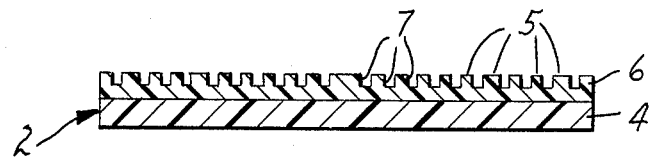
FIG. 1 shows a cross-section view of an information carrying disc.

Information carrying elements are made according to the process of the present invention. A cross-section of an information carrying disc 2 is shown in FIG. 1. A substrate 4 carries an information carrying layer 6 which has depressions or grooves 7 or protuberances 5 thereon. As hereinafter described, substrate 4 may be opaque or transparent. If the substrate is opaque to the radiation used for curing the photopolymerizable liquid, a stamper substantially transparent to this radiation must be used. A reflective layer or primer layer or both may be present between the substrate 4 and the information carrying layer 6.

Figure 2:
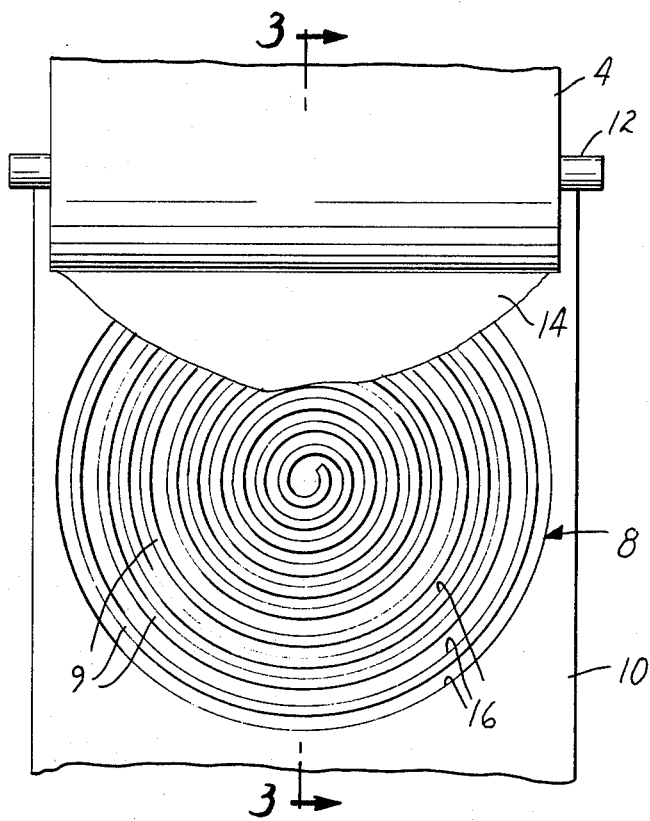
FIG. 2 shows a view of apparatus which could typically be used to practice the present invention.

The process itself can be more readily understood from FIG. 2. The substrate 4 is moved by an element 12 over the stamper carrying surface 10. On this surface, facing upwards towards the advancing substrate 4 is a negative mold 8 of the information carrying disc or disc blank to be replicated. The pattern 9 on the mold 8 is the specific pattern to be duplicated. An element 12 advances substrate 4 so that it flattens out over the surface 10, a mass of photopolymerizable liquid 14 is also advanced over the surface 10 and the pattern 9 on the mold 8. If the stamper is both transparent and flexible, the relative positions of the substrate and stamper may be reversed.

Figure 3:
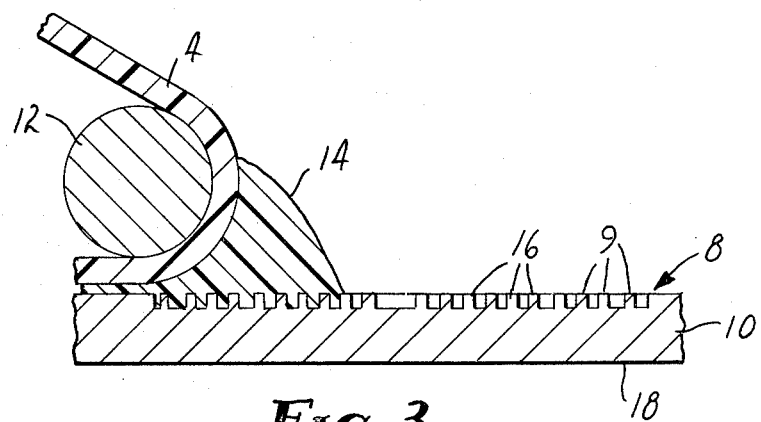
FIG. 3 shows a side view of apparatus which could typically be used to practice the present invention.

The dynamics of the process can be readily seen in FIG. 3. As element 12 advances the substrate 4 over the stamper 10, a bead of photopolymerizable liquid 14 is advanced in front of the substrate 4. The liquid 14 fills the depressions 16 in the mold 8. The photopolymerizable liquid 14, after it has been spread over the mold 8 and when the substrate 4 is laying over it can be cured by irradiation transmitted through either the mold 8 from the backside 18 of the stamper 10 or through the substrate 4. After curing of the photopolymerizable liquid 14, the substrate 4 is lifted off of the mold 8 carrying the polymerized resin with it. This produces the article of FIG. 1.

Another manner of propagating the advancing bead of liquid within the practice of the present invention is with an essentially flat or rigid layer. By placing the mass of liquid on one side of an upright or angled rigid substrate or master, the rigid layer may be rotated about the lower edge so as to squeeze a bead of liquid forward until the rigid layer and the other substrate enclosing the liquid are essentially parallel. This operates substantially better than would simple hand spreading of a liquid and pressing with a stamper because of reduced air entrapment. This method can be described as (1) moving a first layer relative to a second layer from a non-parallel to a parallel position so as to spread in the form of a bead, a photopolymerizable liquid mass between the two layers, one of said layers having a patterned surface facing the other layer with a circular, arc-like, or spiral pattern of depressions, protuberances, grooves with or without modulations or combinations of depressions, protuberances and grooves with or without modulations, the other of said layers having a surface to which the photopolymerizable liquid will bond upon polymerizing, (2) then irradiating said photopolymerizable liquid to polymerize said liquid and bond the polymer formed to the other of said layers, and then (3) removing said polymeric resin and the layer to which it is bonded from said patterned surface.

The composition of the photopolymerizable material may be any material which polymerizes into a polymeric resin which has satisfactory properties for use in an information carrying disc or disc blank. The polymeric resin usually is at least transparent for the radiation used to read information off the disc. Ordinarily a fairly narrow band of radiation is used for these purposes so that the photopolymerizable liquid and the polymeric resin only preferably should be transmissive of at least 50% of the radiation in a 100 nm, 50 nm, or 30 nm band. Preferably the layer is transmissive of at least 75 to 90% of the radiation within such a band.

Many different types of photopolymerizable systems are useful. Acrylates (including methacrylates), epoxy resins, silanes, vinyl resins, and others are useful photopolymerizable systems. The preferred polymerizable systems of the present invention are ambifunctional silanes and polyacryloyl polymerizable systems. Ambifunctional silanes are materials (monomers and/or hydrolyzates and precondensates thereof) having a di- or trialkoxy silane on one end and a different polymerizable group, such as an epoxy, acryloyl (including methacryloyl), or vinyl group on the other end. A formula for these materials would be:

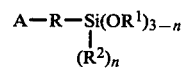

wherein A is an epoxy, acryloyloxy, or vinyl containing group,

R is a divalent organic radical, $R^1$ is a monovalent organic radical such that $OR^1$ is hydrolyzable, $R^2$ is a monovalent organic radical, and n is 0 or 1, and most preferably 0.

A is preferably selected from the groups

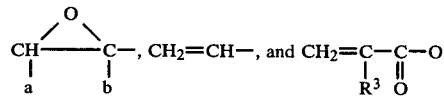

wherein a and b are selected from H, or, when fused together, represent the atoms necessary to form a 5- or 6-membered cycloaliphatic ring, and $R^3$ is H or $CH_3$.

R is preferably an alkylene group which may be interrupted with an oxygen atom. Preferably the group has from 1 to 16 total carbon atoms and more preferably may be represented by the formula

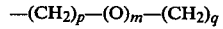

wherein p is 1 to 6, m is 0 or 1, and q is 1 to 6.

$R^1$ is preferably alkyl or acyl of 1 to 10 carbon atoms and most preferably alkyl of 1 to 3 carbon atoms.

$R^2$ may be H or alkyl of 1 to 10 carbon atoms.

As noted above, these compounds are most preferably trialkoxy silanes.

A preferred class of polyacryloyl compounds for use in the process of the present invention is described in U.S. Pat. Nos. 4,249,011 and 4,262,072. The class herein defined as "polyacryloyl heterocyclics" are represented by the formulae:

$$A^1\text{-}Z\text{-}A^2 \qquad (1)$$

wherein $A^1$ and $A^2$ independently are alkoxyalkyl groups having terminal ethylenic unsaturation and having the formula

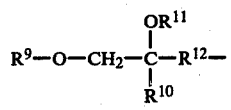

wherein $R^9$—O— is a monovalent residue of an aliphatic terminally unsaturated primary alcohol, $R^9OH$, formed by the removal of the active hydrogen from the primary —OH group, $R^9$ having the formula:

$$[E\text{+}CH_2\text{)}_d\text{+}_tR^{13}\text{+}CH_2\text{)}_c$$

wherein E is 
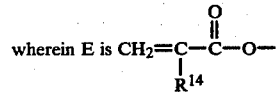

c is an integer of from 1 to 6, d is zero or an integer of from 1 to 6, $R^{10}$ and $R^{14}$ are independently selected from hydrogen and methyl, $R^{13}$ is an aliphatic group having from 1 to 15 carbon atoms, and no more than two catenary oxygen or carboxy groups, a valence of m+1, t is an integer of from 1 to 5, $R^{11}$ is selected from hydrogen and groups of the formula

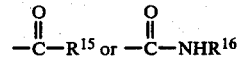

wherein $R^{15}$ is selected from alkyl and alkenyl groups $R^{16}$ is an aliphatic or aromatic group of up to eight carbon atoms, $R^{12}$ is an alkylene group of from 1 to 6 carbon atoms with up to one catenary oxygen atom, and Z is a heterocyclic group of the formula

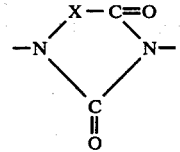

wherein X is a divalent group which is required to complete a 5- or 6-membered heterocyclic ring, or

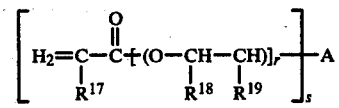

wherein $R^{17}$ and $R^{18}$ independently represent hydrogen or methyl, $R^{19}$ represents hydrogen, an alkyl group, or a phenyl group, $R^{18}$ and $R^{19}$ together may represent a trimethylene or tetramethylene group, r represents a number of from 1 to 30, s is 2 or 3, and A represents a group of the formula

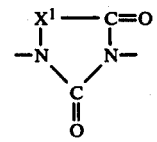

wherein $X^1$ represents the divalent radical necessary to complete a 5- or 6-membered heterocyclic ring group The more preferred compounds of this class are selected from those where m is 1 to 4 in formula (1) and in formulae (1) or (2) $X^1$ and X are selected from

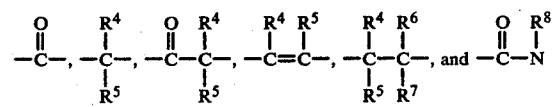

wherein $R^4$, $R^5$, $R^6$ and $R^7$ independently represent hydrogen, and alkyl group, an alkylene group, a cycloalkyl group, or a phenyl group, and $R^8$ represents hydrogen, an aliphatic group, or an aromatic group.

except, that with regard to X, $R^8$ is an alkyoxyalkyl group as defined for $A^1$ and $A^2$. Most preferably X and $X^1$ are selected from

wherein $R^4$ and $R^5$ are hydrogen or alkyl of 1 to 4 carbon atoms.

It is also preferred that t is 2 to 5, $R^9$ is $$[E\text{+}CH_2\text{)}_d\text{+}_mR^{13}\text{+}CH_2\text{)}_c$$

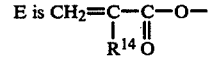

and $R^{13}$ is alkylene of 1 to 13 carbon atoms.

These compounds, as noted above, may be pure monomers, or, particularly in the case of the epoxy-silanes, hydrolyzates or precondensates. In addition, copolymerizable materials may be combined therewith. In fact, in some instances, copolymers are preferably combined with the compounds. Either aliphatic or cycloaliphatic epoxy comonomers are useful in the epoxy-terminated silanes, as are other copolymerizable silanes. Acrylates, preferably diacryloyloxy and dimethacryloyloxy (as well as tri-, tetra-, and penta-functional acryloyloxy materials) are useful comonomers with both the acryloyloxy-terminated silanes and the polyfunctional acryloyloxy-substituted heterocyclics described above. The use of the copolymerizable materials in conjunction with the preferred compounds of the invention is well described in the prior art, as for examples U.S. Pat. Nos. 4,049,861, 4,101,513, 4,084,021 and U.S. patent application Ser. No. 51,888 and U.S. Pat. Nos. 4,249,011 and 4,262,072.

In each of these systems, it is desirable to add materials that will render them sufficiently photosensitive, for the preferred compounds and compositions made therefrom are not inherently photosensitive to a useful degree. With the silane containing compounds, at least a cationic photoinitiator is desirable, and when using the acryloyloxy-terminated silane, or the polyaryloyloxy-containing heterocyclics a free radical photoinitiator should also be present. These materials are well known in the art and are thoroughly described in U.S. Pat. Nos. 4,049,861, 4,101,513, 4,058,400, 4,058,401 and U.S. patent application Ser. No. 51,888, and U.S. Pat. Nos. 4,249,011 and 4,262,072 and the literature. Preferred cationic photoinitiators are the $SbF_6^-$, $PF_6^-$, $BF_4^-$, and $AsF_6^-$ salts of polyaryl iodonium and sulfonium salts. Preferred free radical photoinitiators are polyaryl iodonium and sulfonium salts and the phenones.

The compounds discussed above are generally preferred because they may be used without solvents. The absence of solvents prevents trapping of the solvents in the coating during cure. The preferred compounds, as noted in the prior art described above, also produce highly abrasion resistant and solvent resistant articles which are particularly desirable. In the case of the ambifunctional silanes, and particularly the epoxy- and acryloyloxy-terminated silanes, highly abrasion resistant materials are produced when the ambifunctional silanes comprise at least 30% by weight of the reactive ingredients. With the described heterocyclic acrylates, at least 15% by weight and preferably 25% by weight of the composition should be the heterocyclic acryloyloxy materials for abrasion resistance and/or oxygen insensitivity.

Other additives such as antioxidants, lubricants, surfactants, flow control factants, flow control aids, fillers, dyes, etc. may be present in the composition of the present invention. These and other aspects of the invention may be understood from the following examples.

EXAMPLE 1

A highly hydrolyzed precondensate of γ-glycidoxypropyl-trimethoxy silane (about 80–90% of methoxy groups removed) (70 gm) was mixed with 30 gm of 1,4-diglycidoxybutane and 2 gm of triarylsulfonium hexafluoroantimonate photocatalyst described in assignee's U.S. Pat. No. 4,173,476 by shaking for 3 hours. Bubbles were then removed from the mixture by placing it in an evacuated chamber for 15 minutes. The resulting photopolymerizable material was used to make a video disc replica according to the following roll coating process.

A nickel video disc stamper was utilized. Approximately 2.0 cm$^3$ of the material prepared as described above is spread by a cylindrical coating roller between a video disc stamper and a primed 0.18 mm polyester film. The sheet of 0.18 mm thick polyester film was positioned between the stamper and the roller to serve as a base element. This rolling process spread out a bubble free coating of resin composition over the surface of the stamper and simultaneously covered it with the polyester sheet. The stamper covered in this manner was then passed at 3 cm/sec under a 200 watt/inch high intensity medium pressure Hg vapor lamp. The UV exposure cured and hardened the resin composition. After this exposure, the laminated structure containing the replicated information was easily peeled from the nickel stamper. The sheet was then cut to produce a circular center hole and a circular outside edge, both concentric with the replicated information grooves.

The resulting video disc replica had an information bearing layer which was approximately 10±5 m thick which did not curl when laid on a flat surface. It retained this flatness after more than one year under ambient conditions and produced a good television picture when played on a commercial video disc player.

EXAMPLE 2

A resin composition was prepared by mixing 60 gm of 1,3-bis{3-[2,2,2-(triacryloyloxymethyl)ethoxy]-2-hydroxypropyl}-5,5-dimethyl-2,4-imidizolidinedione (containing approximately 25% pentaerythritol tetraacrylate), referred to as Compound A in the remaining examples, with 40 gm 1,6-hexanediol diacrylate and 2 gm 2,2-dimethoxy-2-phenyl-acetophenone. This composition was mixed by shaking and then filtered through a 5 μm filter. The resulting photopolymerizable material was used to make a video disc replica according to the roll coating process of Example 1 using polyvinylidenechloride primed polyester as the substrate.

The resulting video disc replica had an information bearing layer 10±5 μm thick. This disc lay flat when placed on a level surface. It provided a good television picture when played on a video disc player.

EXAMPLE 3

A resin composition was prepared by mixing 70 gm of Compound A with 30 gm of hexanediol diacrylate and 2 gm of the photoinitiator of Example 1. The resulting material was used to make a video disc according to the procedure of Example 1. The video disc replica made in this way had a cured information bearing layer 6±2 μm thick. This disc lay flat when placed on a level surface. It provided a good television picture when played on a video disc player.

EXAMPLE 4

A resin composition was prepared by mixing 30 gm of Compound A with 70 gm of hexanediol diacrylate and 2 gm of the photoinitiator of Example 1. The resulting material was used to make a video disc according to the procedure of Example 1. The video disc replica made in this way had a cured information bearing layer 5±2.5 μm thick. This disc lay flat when placed on a level surface. It provided a good television picture when played on a video disc player.

EXAMPLE 5

A sample of commercially available polyvinylchloride film 14 inches square was prepared for use as a video disc substrate in the following way. The sheet was placed between two flat, smooth, chrome-steel plates. The plates were in turn sandwiched between four layers of cardboard and the resulting stack pressed for ten minutes in a hydraulic press. The press was operated with a force of 11 metric tons, and the press platens were heated to 160° C. This pressing operation reduced the surface roughness of the manufactured film and provided a substrate of suitable flatness.

The substrate thus prepared was used to make a video disc replica according to the procedure of Example 2, except that the surface of the polyvinylchloride opposite the information bearing layer was also coated with the resin composition. The cured polymer shows good adhesion to the otherwise untreated surface of the polyvinylchloride substrate. The disc lay flat when placed on a level surface and provided a good television picture when played on a video disc player. Information could be read from this disc with the laser beam incident from either side of the disc.

EXAMPLE 6

A sheet of cast acrylic material (polymethylmethacrylate) 1000 μm thick was sputter etched according to the following procedure to promote adhesion of the polymer. The acrylic substrate was placed in a Vecco Model 776 radio frequency diode sputtering apparatus operating at a frequency of 13.56 MHz. The substrate was then subjected to a radio frequency sputter etch as described in assignee's copending application Ser. No. 80,530 (filed Oct. 10, 1974).

The resin composition of Example 2 and the roll coating technique of Example 2 was used to prepare a video disc replica with the above described substrate. The semi-flexible substrate was allowed to bend slightly when it was lowered slowly onto the stamper as the roller moved along. The resin composition was cured with a bank of low intensity UV lamps, and the replica removed from the stamper. An aluminum coating 30 nm thick was vapor coated onto the surface of the information bearing layer. A circular hole was cut in the center of the disc, and a circular outer edge was cut. The resulting disc was then played on a video disc player; a good television picture was obtained. The laser beam of the player was incident through the uncoated acrylic surface and reflected by the aluminum coating on the information bearing surface.

EXAMPLE 7

A resin composition was made by mixing 70 gm of a precondensate of γ-methacryloxypropyltrimethoxy silane (made according to U.S. patent application Ser. No. 911,892, filed June 2, 1978) with 30 gm of hexanedioldiacrylate and 2 gm of 2,2-dimethoxy-2-phenyl- acetophenone. The resulting material was used to make a video disc according to the procedure of Example 1 except that the resin was cured under a bank of low intensity "black lights" for 15 minutes. The video disc replica made in this way had a cured information bearing layer 6±3.5 μm thick. This disc lay flat when placed on a level surface. It provided a good television picture when played on a video disc player.

EXAMPLE 8

A resin composition was made by mixing 90 gm γ-glycidoxypropyltrimethoxy silane with 10 gm limonene oxide and 2 gm of the photocatalyst of Example 1. The resulting material was used to make a video disc according to the procedure of Example 1 except that the resin was cured under a bank of low intensity "black lights" for 30 minutes. The video disc replica made in this way had a cured information bearing layer 5±3 μm thick. This disc lay flat when placed on a level surface. It provided a television picture when played on a video disc player but gave a slightly low signal level.

EXAMPLE 9

A video recording was made in a commercially available polymeric photoresist layer and the layer developed by standard wash-development techniques after exposure. The recording was then vapor coated with 10 nm of chrome. The resulting photoresist stamper was used in place of a nickel stamper to make a video disc replica according to the procedures of example 1. This replica was playable. When vapor coated with 10 nm of chrome and used in place of a nickel stamper, repeated playable replications were made.

EXAMPLE 10

A photoresist stamper was made according to the procedure of example 9. This stamper was used in place of a nickel stamper to produce a video disc replica according to the procedure of example 2. This replica provided a good television picture when played on a video disc player and again there was no significant wear on the stamper.

EXAMPLE 11

An audio record replica was prepared using commercially available 1 mm polyvinylchloride as the base element. The resin composition of Example 1 was used with the roll-coating technique of Example 1. The semi-flexible base element was allowed to bend slightly as it was lowered slowly onto the audio record stamper as the roller moved along. The resin composition was cured with a bank of low intensity UV lamps, and the replica stripped from the stamper. A circular hole was cut in the center of the record and a circular outer edge was cut. The resulting replica had an information bearing layer approximately 50 μm thick. The audio record replica was successfully played on a conventional stereo audio system.

I claim:

1. A method for making an information carrying disc or disc blank which comprises (1) moving a first layer relative to a second layer from a nonparallel to a parallel position so as to spread in the form of a bead, a photopolymerizable liquid mass between the two layers, one of said layers having a patterned surface facing the other layer with a circular, arc-like, or spiral pattern of depressions, protuberances, grooves with or without modulations or combinations of depressions, protuberances and grooves with or without modulations, the other of said layers having a surface to which the photopolymerizable liquid will bond upon polymerizing, (2) then irradiating said photopolymerizable liquid to polymerize said liquid and bond the polymer formed to the other of said layers, and then (3) removing said polymer and the layer to which it is bonded from said patterned surface.

2. A method for making an information carrying disc or disc blank which comprises moving a bead of photopolymerizable liquid composition over a first surface by advancing said bead in front of a flexible layer having a facing surface in contact with said liquid so that said flexible layer lies substantially parallel to said first surface with said liquid between the flexible layer and the first surface in the direction from which the bead advances, and the flexible layer is angled away from the first surface in the direction towards which the bead advances, and there is a supporting surface located on the side of the flexible layer away from said facing surface along the length of the flexible layer at least in part between the area of the flexible layer that changes from angling away from the first surface to lying parallel to said first surface, by bending said flexible layer wherein one of said first surface and said facing surface has a patterned surface in contact with said photopolymerizable liquid which is selected from the group consisting of circular patterns, arc-like patterns, and spiral patterns of depressions, grooves, protuberances and combinations of depressions, grooves and protuberances, advancing the bead until it covers the area of the patterned surface, irradiating said polymerizable liquid to convert it to a polymeric resin and bond it to whichever of said first surface and facing surface which is not said patterned surface, and then removing said polymeric resin and the surface to which it is bonded from said patterned surface.

3. The method of claims 1 or 2 wherein said photopolymerizable liquid comprises at least 30% by weight of radiation polymerizable components selected from epoxy-terminated silanes.

4. The method of claim 3 wherein said epoxy-terminated silane is represented by one of the formulae:

$$CH_2 \underset{\underset{O}{\diagup\diagdown}}{\text{———}} CH-R-Si(OR^1)_3$$

wherein R is a divalent organic radical of the formula $$-(CH_2)_p-(O)_m-(CH_2)_q$$

wherein p is 1 to 6,
m is 0 or 1, and
q is 1 to 6 and
$R^1$ is alkyl of 1 to 3 carbon atoms.

5. The method of claim 4 wherein said photopolymerizable liquid comprises from 10 to 70% by weight of an epoxy monomer copolymerizable with said epoxy-terminated silane.

6. The method of claim 2 wherein said photopolymerizable liquid comprises 10 to 70% by weight of an acrylate copolymerizable with said radiation polymerizable components.

7. The method of claim 2 wherein said photopolymerizable liquid comprises at least 30% by weight of an epoxy-terminated silane and said flexible layer is a transparent polymeric film.

8. The method of claim 2 wherein said photopolymerizable liquid comprises at least 15% by weight of polyacryloyl heterocyclics and said flexible layer is a transparent polymeric film.

9. The method of claims 1 or 2 wherein said photopolymerizable liquid comprises at least 30% by weight of radiation polymerizable components having the formula:

$$A^1-Z-A^2 \qquad (1)$$

wherein $A^1$ and $A^2$ independently are alkoxyalkyl groups having terminal ethylenic unsaturation and having the formula $$R-O-CH_2-\underset{\underset{R^1}{|}}{\overset{\overset{OR^2}{|}}{C}}-R^3-$$

wherein R—O— is a monovalent residue of an aliphatic terminally unsaturated primary alcohol, ROH, formed by the removal of the active hydrogen from the primary —OH group, R having the formula:

$$[E(CH_2)_b]_m R^5(CH_2)_c$$

wherein E is or $CH_2=\underset{\underset{R^4}{|}}{C}-\overset{\overset{O}{\|}}{C}-O-$ c is an integer of from 1 to 6,
b is zero or an integer of from 1 to 6,
$R^1$ and $R^4$ are independently selected from hydrogen and methyl,
$R^5$ is an aliphatic group having from 1 to 15 carbon atoms, and no more than two catenary oxygen or carboxy groups, a valence of m+1,
m is an integer of from 1 to 5,
$R^2$ is selected from hydrogen and groups of the formula $$-\overset{\overset{O}{\|}}{C}-R^6 \text{ or } -\overset{\overset{O}{\|}}{C}-NHR^7$$

wherein $R^6$ is selected from alkyl and alkenyl groups
$R^7$ is an aliphatic or aromatic group of up to eight carbon atoms,
$R^3$ is an alkylene group of from 1 to 6 carbon atoms with up to one catenary oxygen atom, and
Z is a heterocyclic group of the formula $$-N\underset{\diagdown}{\overset{\diagup}{\phantom{x}}}\overset{X-C=O}{\underset{\underset{O}{\|}}{\underset{C}{\diagdown\phantom{x}\diagup}}}N-$$

wherein X is a divalent group which is required to complete a 5- or 6-membered heterocyclic ring, or $$\left[CH_2=\underset{\underset{R^{12}}{|}}{C}-\overset{\overset{O}{\|}}{C}-\left[O-\underset{\underset{R^{13}}{|}}{CH}-\underset{\underset{R^{14}}{|}}{CH}\right)_p\right]_q-A \qquad (2)$$

wherein $R^{12}$ and $R^{13}$ independently represent hydrogen or methyl,
$R^{14}$ represents hydrogen, an alkyl group, or a phenyl group,
$R^{13}$ and $R^{14}$ together may represent a trimethylene or tetramethylene group,
p represents a number of from 1 to 30,
q is 2 or 3, and
A represents a group of the formula

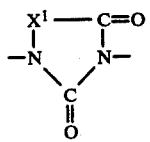

wherein $X^1$ represents the divalent radical necessary to complete a 5- or 6-membered heterocyclic ring group.

10. The method of claim 9 wherein said radiation polymerizable component has the formula:

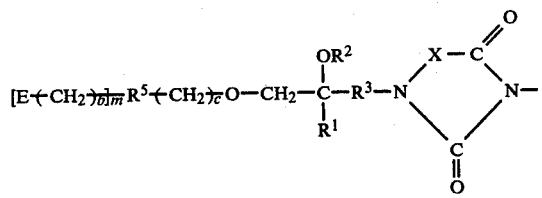

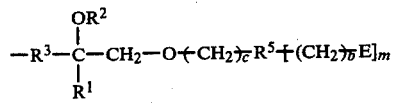

wherein E is 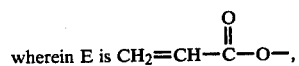, b is zero or 1 to 6,
m is 2 to 5,
$R^5$ is alkylene of 1 to 13 carbon atoms,
c is 1 to 6,
$R^2$ is hydrogen,
$R^1$ is hydrogen,
$R^3$ is an alkylene group of 1 to 6 carbon atoms, and
X is

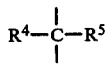

wherein $R^4$ and $R^5$ are hydrogen or alkyl of 1 to 4 carbon atoms.

11. The method of claim 1 wherein said bead has a leading edge which picks up and carries air in the patterned surface without redepositing it in progressive features of the patterned surface.

12. The method of claim 2 wherein said bead has a leading edge which picks up and carries air in the patterned surface without redepositing it in progressive features of the patterned surface.

13. The method of claims 1, 2, 8, 11 or 12 wherein said patterned surface is a metal layer.

14. The method of claims 1, 2, 8, 11 or 12 wherein either said layer with a patterned surface or said other layer is flexible and said flexible layer bends to propagate the bead as the bend-point is moved forward.

* * * * *